(12) United States Patent
Skalicky et al.

(10) Patent No.: US 10,635,769 B1
(45) Date of Patent: Apr. 28, 2020

(54) HARDWARE AND SOFTWARE EVENT TRACING FOR A SYSTEM-ON-CHIP

(71) Applicant: Xilinx, Inc., San Jose, CA (US)

(72) Inventors: Samuel A. Skalicky, San Jose, CA (US); L. James Hwang, Portola Valley, CA (US); Vinod K. Kathail, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 902 days.

(21) Appl. No.: 14/962,878

(22) Filed: Dec. 8, 2015

(51) Int. Cl.
*G06F 17/50* (2006.01)

(52) U.S. Cl.
CPC ...... *G06F 17/5045* (2013.01); *G06F 17/5077* (2013.01); *G06F 17/5081* (2013.01)

(58) Field of Classification Search
CPC ............. G06F 17/5045; G06F 17/5081; G06F 17/5077
USPC ......................................................... 716/138
See application file for complete search history.

(56) References Cited

U.S. PATENT DOCUMENTS

| | | | |
|---|---|---|---|
| 2011/0239196 A1* | 9/2011 | Ichard | G06F 11/3636 717/127 |
| 2017/0193055 A1* | 7/2017 | Harn | G06F 17/30539 |

* cited by examiner

*Primary Examiner* — Jack Chiang
*Assistant Examiner* — Brandon Bowers
(74) *Attorney, Agent, or Firm* — Kevin T. Cuenot (57) ABSTRACT

Event tracing for a system-on-chip (SOC) may be implemented by instrumenting, using a computer, a design for the SOC with instrumentation program code that, responsive to execution by a processor of the SOC, generates software trace events. The design may be specified in a high level programming language. A circuit design specifying an accelerator circuit for a function of the design may be generated using the computer. The accelerator circuit is configured for implementation within programmable circuitry of the SOC. The circuit design may be instrumented to include trace circuitry using the computer. The trace circuitry may be configured to detect hardware trace events for operation of the accelerator circuit, receive the software trace events, and combine the hardware and software trace events into time synchronized trace data.

19 Claims, 5 Drawing Sheets

FIG. 6

US 10,635,769 B1

HARDWARE AND SOFTWARE EVENT TRACING FOR A SYSTEM-ON-CHIP

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to event tracing across both hardware and software for a system-on-chip type of IC.

BACKGROUND

A "system-on-chip" or "SOC" is a type of integrated circuit (IC). An SOC includes one or more processors that execute program code and one or more other circuits coupled to, and that operate cooperatively with, the processor(s). The processor(s) may execute program code in the context of a system run-time, e.g., an operating system. In some cases, the SOC may include programmable circuitry that is coupled to the processor. The programmable circuitry may be configured, by loading configuration data, to implement any of a variety of different types of systems therein. In one example, an SOC may include a hardwired processor coupled to field programmable gate array (FPGA) circuitry.

A design to be implemented within an SOC is multi-faceted. For example, the design will include program code that is executed by the processor(s) within the SOC. The design will also include a circuit design. The circuit design is implemented within the programmable circuitry of the SOC. In a well-crafted SOC, both the program code and the circuit design must operate correctly as intended. Further, the processor, in executing the program code, and the circuits implemented within the programmable circuitry must interact with one another in an efficient manner.

SUMMARY

A method of automatically implementing event tracing for a system-on-chip (SOC) may include instrumenting, using a computer, a design for the SOC with instrumentation program code that, responsive to execution by a processor of the SOC, generates software trace events. The design may be specified in a high level programming language. The method may include generating, using the computer, a circuit design specifying an accelerator circuit for a function of the design. The accelerator circuit may be configured for implementation within programmable circuitry of the SOC. The method may also include instrumenting, using the computer, the circuit design to include trace circuitry. The trace circuitry is configured to detect hardware trace events for operation of the accelerator circuit, receive the software trace events, and combine the hardware and software trace events into time synchronized trace data.

An SOC may include a processor configured to execute instrumented program code and, responsive to execution of the instrumented program code, output software trace events. The SOC may include an accelerator circuit configured to implement a hardware accelerated function in programmable circuitry of the SOC. The accelerator circuit is coupled to the processor. The SOC may also include a trace circuitry implemented within the programmable circuitry of the SOC and coupled to the processor and accelerator circuit. The trace circuitry may be configured to detect hardware trace events, receive the software trace events, and generate time synchronized trace data.

A method of tracing hardware and software of an SOC may include generating software trace events using a processor of the SOC and generating, using trace circuitry implemented within programmable circuitry of the SOC, hardware trace events for operation of an accelerator circuit implementing the function within the programmable circuitry. The method may include time stamping, using the trace circuitry, the hardware and software trace events using a common timing reference and generating, using the trace circuitry, time synchronized trace data comprising the time stamped hardware and software trace events.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to event tracing across both hardware and software for a system-on-chip (SOC) type of IC. In accordance with the inventive arrangements described within this disclosure, a design for an SOC may be specified in a high level programming language (HLL) and processed by a system compiler. The system compiler may compile portions of the design for execution by a processor of the SOC and compile other portions of the design into hardware that may be implemented within programmable circuitry of the SOC.

In one arrangement, the system compiler may instrument the design to implement event tracing across hardware and software within the SOC. The system compiler may insert hardware circuitry to monitor hardware events and insert program code to monitor software events as portions of the design execute on the processor(s) of the SOC. Instrumentation of the hardware and/or software of the design may be performed automatically. The system compiler may include instrumentation program code within the portions of the design that are to be executed by the processor of the SOC. The system compiler further may generate a circuit design that specifies accelerator circuits for functions of the design designated for implementation in hardware, e.g., designated for hardware acceleration. In generating the circuit design, the system compiler may also instrument the circuit design to include hardware circuitry, such as trace circuitry, therein.

The trace circuitry may detect hardware trace events within the hardware portion of the SOC. The trace circuitry may detect application level hardware trace events that occur within the hardware portion of the design as implemented in the programmable circuitry of the SOC. In addition, the trace circuitry may receive software trace events generated by the processor of the SOC while executing the instrumented program code. In one aspect, the trace circuitry may generate synchronized trace data that includes both hardware and software trace events. The trace circuitry may time stamp the hardware and software trace events using a common timing reference. As such, the hardware and software trace events may be merged, or combined, into a unified timeline.

Figure 1:
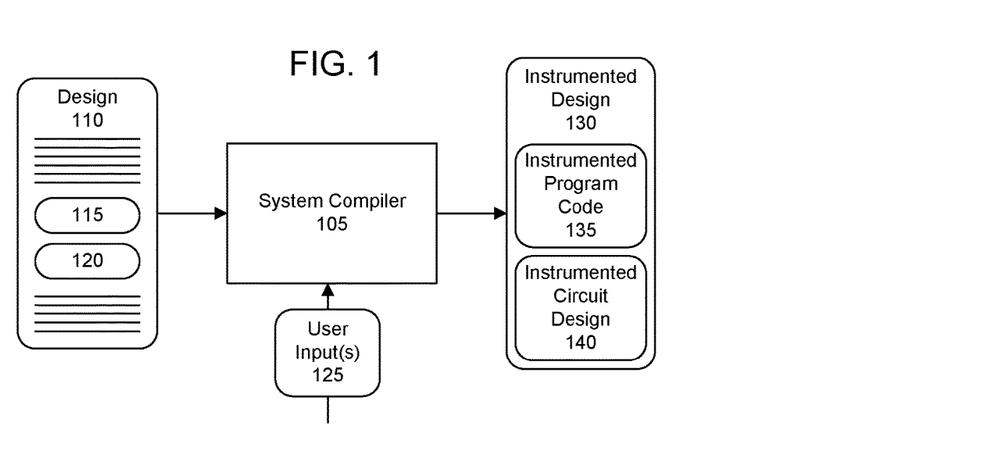
FIG. 1 is a block diagram showing an example of implementing hardware and software event tracing using a system compiler.

FIG. 1 is a block diagram showing an example of implementing hardware and software event tracing using a system compiler 105. System compiler 105 may be implemented as a data processing system, e.g., a computer. System compiler 105 may execute an electronic design automation application such as a compiler application. System compiler 105 may operate on a design 110. Design 110 may be specified using an HLL. Further design 110 may be specified using source code. In one aspect, system compiler 105 may transform design 110, at least in part, into an application program that may execute under an operating system running on processor(s) of a particular, e.g., target, SOC.

As defined herein, the term "high level programming language" or "HLL" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL, or the like.

As defined within this disclosure, the term "source code" means a collection of computer instructions written using a human-readable computer language such as text. It should be appreciated that different computer languages may be expressed as source code. For example, a hardware description language (HDL) such as VHDL and/or Verilog may be expressed as source code and subsequently compiled, e.g., synthesized, placed, and/or routed. HLL may be expressed as source code and subsequently compiled, e.g., into object code or an executable binary for execution by a processor.

Design 110, being specified in an HLL, may include a plurality of functions. Since design 110 is intended for implementation within an SOC, design 110 may be considered heterogeneous. Heterogeneity, as applied to design 110, means that some portions are intended for execution by a processor of the SOC and other portions are intended to be implemented as hardware within programmable circuitry of the SOC as one or more accelerator circuits. Functions to be implemented in hardware are said to be designated for hardware acceleration. As defined within this specification, an accelerator circuit is a hardware implementation of a portion of design 110, such as a function, that is functionally equivalent to the portion of program code the accelerator circuit implements.

For purposes of illustration, design 110 includes functions 115 and 120, which have been designated for hardware acceleration. In one aspect, for example, user inputs 125 may select functions 115 and 120 for hardware acceleration. Further user inputs 125 may indicate that hardware/software tracing for design 110, as implemented within an SOC, is desired.

System compiler 105 processes design 110 to generate instrumented design 130. In one aspect, instrumented design 130 may include instrumented program code 135 and an instrumented circuit design 140. For purposes of discussion, instrumented program code 135 may be an executable or binary file or files. Instrumented circuit design 140 may be a configuration bitstream.

In one aspect, system compiler 105 may instrument the portion of design 110 intended to execute on the processor of the SOC to generate instrumented program code 135. Further, system compiler 105 may instrument the portion of design 110 that is to be implemented in hardware. Instrumenting generally refers the inclusion of instrumentation program code within design 110. Instrumentation program code may implement the collection and writing, or output, of trace events.

In one arrangement, system compiler 105 may perform instrumentation by inserting instrumentation program code within the portion of design 110 designated for execution on the processor of the SOC. Instrumentation of HLL source code may be performed by inserting instrumentation program code, i.e., expressed as source code, into the source code of design 110. The inserted instrumentation program code maybe executed by the processor of the SOC when instrumented design 130 is loaded into the SOC. Instrumentation may also be performed by compiling the HLL source code into a binary file and instrumenting the binary file. While the inventive arrangements are generally described herein with reference to instrumenting source code, it should be appreciated that instrumentation may be performed on compiled program code such as a binary. As such, the inventive arrangements are not intended to be limited by the particular manner in which design 110 is instrumented.

System compiler 105 may perform instrumentation of the portion of design 110 that is to be hardware accelerated in a variety of different ways. In one aspect, functions 115 and 120 may be converted into HDL as part of a circuit design. System compiler 105 may perform instrumentation of the circuit design by adding further HDL that defines tracing circuitry to the circuit design expressing functions 115 and 120. System compiler 105 may then synthesize, place, and route the HDL and generate a configuration bitstream. In another example, system compiler 105 may operate on, i.e., instrument, the netlist generated from synthesizing the HDL. While the inventive arrangements are generally described herein with reference to instrumenting HDL, it should be appreciated that instrumentation may be performed on the synthesized netlist or other intermediate forms of the circuit design. As such, the inventive arrangements are not intended to be limited by the particular manner in which the circuit design is instrumented.

As defined herein, the term "hardware description language" or "HDL" is a computer-language that facilitates the documentation, design, and manufacturing of a digital system, such as an integrated circuit. An HDL is expressed in human readable form and combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, e.g., clocks and/or clock signals, which is a primary attribute of a digital system. For example, an HDL design may describe the behavior of a circuit design as data transfers occur between registers each clock cycle. Examples of HDLs may include, but are not limited to, Verilog and VHDL. HDLs are sometimes referred to as register transfer level (RTL) descriptions of circuit designs and/or digital systems. Both Verilog and VHDL support the ability to specify attributes on modules in their native syntax.

An example of design 110 is shown below in Example 1. Example 1 is a simplified design for an SOC and is provided for purposes of illustration and not limitation. Example 1 is a design that performs various array operations including multiplication and addition. The design includes a loop in which the two functions shown in bold type have been designated for hardware acceleration. In particular, the "mmult" and "madd" functions have been designated for hardware acceleration.

Example 1

```
bool mmultadd_test(float *A, float *B, float *C, float *Ds, float *D)
{
  float tmp1[A_NROWS * A_NCOLS], tmp2[A_NROWS * A_NCOLS];
  for (int i = 0; i < NUM_TESTS; i++) {
    mmultadd_init(A, B, C, Ds, D);
    mmult(A, B, tmp1);
```

-continued

```
    madd(tmp1, C, D);
    mmult_golden(A, B, tmp2);
    madd_golden(tmp2, C, Ds);
    if (!mult_result_check(D, Ds))
      return false;
  }
  return true;
}
```

In general, system compiler 105 may implement the "mmult" and "madd" functions as accelerator circuits within the programmable circuitry of the SOC. Other portions of the source code are executed by the processor of the SOC. System compiler 105 must generate data movers that provide arguments to the hardware accelerated functions and data movers that move arguments back to the processor of the SOC. In doing so, system compiler 105 may insert trace circuitry that detects hardware trace events relating to the operation of the accelerator circuits implementing "mmult" and "madd" and operation of the data movers. Further, system compiler 105 may insert instrumentation program code that detects software trace events.

As used herein, a "software trace event" is a trace event generated by the processor(s) of an SOC from executing instrumented program code. In one aspect, the software trace events may relate to application program code, e.g., design 110, or other program code stored in user memory space of the SOC. For example, the software trace events may be related and/or generated responsive to, the invocation of the accelerator circuits or functions designated for hardware acceleration. The software trace events may also relate to the operating system, other libraries, or the like. System compiler 105, for example, may instrument the operating system and/or another library and/or process program code.

Figure 2:
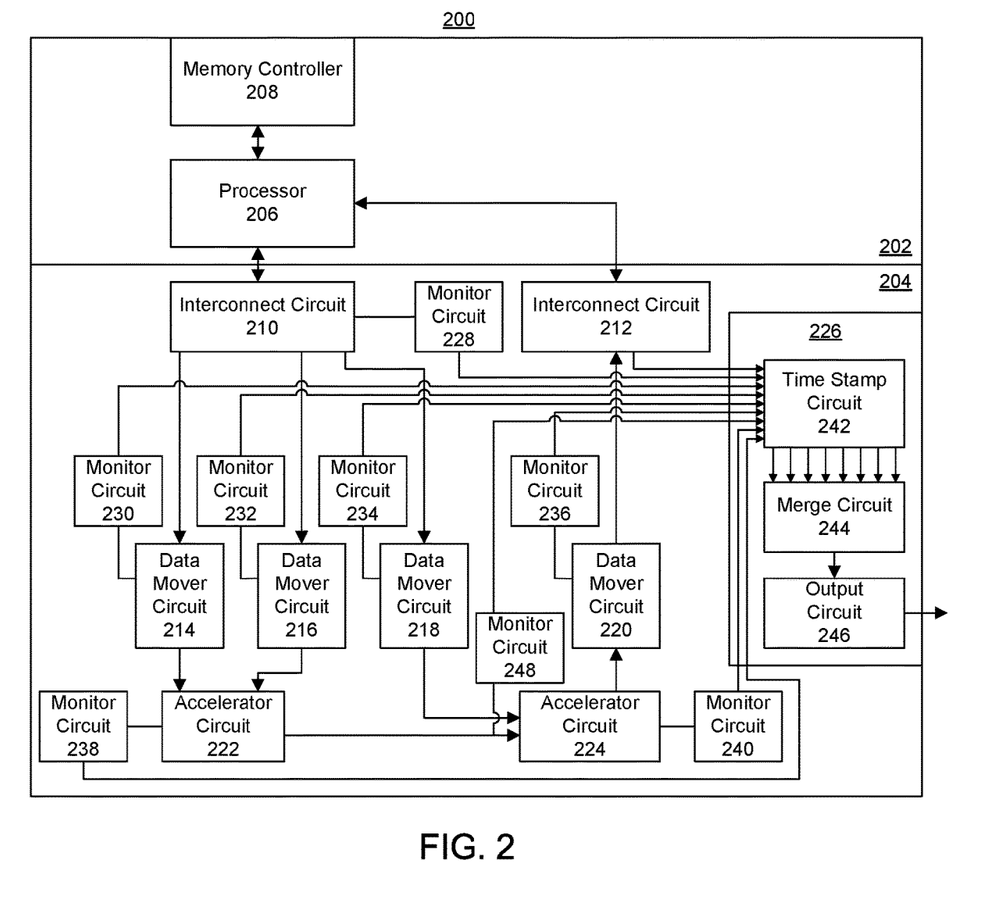
FIG. 2 is a block diagram illustrating an exemplary implementation of an instrumented design within a system-on-chip.

FIG. 2 is a block diagram illustrating an exemplary implementation of an instrumented design within an SOC 200. SOC 200 includes a processor system 202 and programmable circuitry 204. Processor system 202 may be hardwired. Processor system 202 includes a processor 206 configured to execute program code, e.g., a central processing unit (CPU). Processor system 202 may also include a memory controller 208 that is coupled to processor 206. Processor 206 may include on-chip program execution memory (not shown) or access off-chip program execution memory (not shown) through memory controller 208. For example, instrumented program code 135 of FIG. 1 may be loaded into program execution memory and executed by processor 206.

Programmable circuitry 204 may include various programmable tiles such as configurable logic blocks, block random access memories, and other programmable circuit structures. Each programmable tile typically includes both programmable interconnect circuitry and programmable logic circuitry. The programmable interconnect circuitry typically includes a large number of interconnect lines of varying lengths interconnected by programmable interconnect points (PIPs). Programmable circuitry 204 implements the logic of a user design using programmable elements that may include, for example, function generators, registers, arithmetic logic, and so forth.

In general, the functionality of programmable circuitry 204 is not established until configuration data is loaded into the IC. A set of configuration bits may be used to program programmable circuitry 204. The configuration bit(s) typically are referred to as a "configuration bitstream." In general, programmable circuitry 204 is not operational or functional without first loading a configuration bitstream into SOC 200. The configuration bitstream effectively implements the portion of the design to be implemented in hardware within programmable circuitry 204. For example, instrumented circuit design 140 may be loaded into configuration memory cells of SOC 200 to implement the circuit blocks illustrated in programmable circuitry 204 and establish the connectivity among the circuit blocks shown.

For purposes of illustration, consider the case where Example 1 above is used as design 110. As noted, the "mmult" function and the "madd" function are designated for hardware acceleration and implemented as accelerator circuit 222 and accelerator circuit 224, respectively. System compiler 105 has further created additional circuitry to implement accelerator circuits 222 and 224. In particular, system compiler 105 has created interconnect circuits 210 and 212 and data mover circuits 214, 216, 218, and 220.

In the example of FIG. 2, system compiler 105 has created a data mover circuit for each of the arguments passed between processor 206 and one or both of accelerator circuits 222 and 224. In Example 1, the "mmult" function receives input arguments of A and B, each being an array, and generates an output argument of tmp1, which is also an array. The arguments A and B are provided from processor 206 to accelerator circuit 222. Accordingly, system compiler 105 generates data mover circuit 214 to transfer argument A from processor 206 to accelerator circuit 222. System compiler 105 generates data mover circuit 216 to transfer argument B from processor 206 to accelerator circuit 222.

The "madd" function receives input arguments of tmp1 and C, each being arrays, and outputs the argument D, which is an array. System compiler 105 generates data mover circuit 218 to transfer argument C from processor 206 to accelerator circuit 224. Argument tmp1 is transferred directly from accelerator circuit 222 to accelerator circuit 224 and does not require a data mover circuit. System compiler 105 generates data mover circuit 220 to transfer argument D from accelerator circuit 224 to processor 206.

Instrumented circuit design 140 further includes trace circuitry. Trace circuitry may collectively refer to monitor circuitry and trace event handling circuitry 226. The trace circuitry may include a plurality of monitor circuits such as monitor circuits 228, 230, 232, 234, 236, 238, 240, and 248. Monitor circuit 228 may be coupled to interconnect 210. Monitor circuits 230, 232, 234, and 236 may be coupled to data movers 214, 216, 218, and 220, respectively. Monitor circuits 238 and 240 may be coupled to accelerator circuits 222 and 224, respectively. Monitor circuit 248 may be coupled to the data path coupling accelerator circuit 222 with accelerator circuit 224.

Trace even handling circuitry 226 may include a time stamp circuit 242, a merge circuit 244, and an output circuit 246. Time stamp circuit 242 is configured to receive a plurality of different trace event signals, or data streams. As pictured, time stamp circuit 242 may be coupled to an output of each of monitor circuits 228, 230, 232, 234, 236, 238, 240, and 248 to receive hardware trace events output from each. As a hardware trace event is received from monitor circuits 228, 230, 232, 234, 236, 238, 240, and 248, time stamp circuit 242 may add a time stamp to the hardware trace event. Time stamp circuit uses a timing reference so that each hardware trace event is timestamped in a common or same timeline.

Processor 206 is coupled to interconnect circuit 210 and to interconnect circuit 212. In one arrangement, interconnect circuit 210 and interconnect circuit 212 may be implemented as AXI Interconnect Intellectual Property Cores (AXI interconnects). AXI interconnects may connect one or more AXI memory-mapped master devices to one or more memory-mapped slave devices. The AXI interfaces conform to the AMBA® AXI version 4 specifications from ARM®, including the AXI4-Lite control register interface subset. It should be appreciated, however, that any of a variety of IC level interconnect technologies and/or cores may be used.

Processor 206 may send data to programmable circuitry 204, and, more particularly, to accelerator circuits 222 and 224, through interconnect circuit 210. Processor 204 may receive results output from accelerator circuit 224 through interconnect circuit 212. In addition, interconnect circuit 212 is coupled to time stamp circuit 242. Processor 206, in executing instrumented program code 135, may generate software trace events. Processor 206 may output the software trace events to interconnect circuit 212 which, in turn, may provide the software trace events to time stamp circuit 242.

Time stamp circuit 242 may also time stamp the software trace events received from processor 206. As such, the software trace events are time stamped using the same timing reference used to time stamp the hardware trace events. The software trace events are, therefore, in the same timeline as the hardware trace events. As used within this disclosure, the term "timing reference" may refer to a single clock, a single counter, a single timer, a plurality of different synchronized clocks, a plurality of different synchronized counters, and/or a plurality of different synchronized timers. In one example, 1588-2002 IEEE Standard for a Precision Clock Synchronization Protocol for Networked Measurement and Control Systems may be used where multiple timing references are used. It should be appreciated that any of a variety of different synchronization technologies may be used to unify time stamps and that the particular examples provided herein are for purposes of illustration only.

Merge circuit 244 may receive the time stamped hardware and software trace events. As shown, merge circuit 244 may receive the time stamped hardware and software trace events as a plurality of different trace event signals or streams. Merge circuitry 244 may merge, or combine, the time stamped hardware and software trace events to create synchronized trace data that includes hardware and software trace events. In one exemplary implementation, merge circuit 244 may order the trace data according to time stamp, though ordering is not necessary. Merge circuit 244 may provide the synchronized trace data to output circuit 246. Output circuit 246 may provide the synchronized trace data to one or more other systems located off SOC 200.

In one arrangement, a designer may insert markers such as pragmas or the like to instruct system compiler 105 where to create hardware and/or software trace events within design 110. As design 110 is compiled, system compiler 105 may insert instrumentation program code where appropriate to capture the relevant information specified by the pragma. The type and/or location of the software tracing may be selected by the designer to provide full coverage of the entire program or to selectively choose which type of software trace events to monitor.

In some cases, a design may only be implemented in software and executed by processor 206 of SOC 200. In that case, software trace events may be time stamped by processor 206 and stored in program execution memory. The software trace events may be read out from the program execution memory and displayed to the designer. Accordingly, system compiler 105 does not incur long compile times as a result of implementing hardware trace functionality when not needed.

The inserted instrumentation program code may generate software trace events responsive to detecting function entry and/or exit, memory access(es), loops, and the like Other constructs may be instrumented to provide detailed software trace events. The trace events may provide detailed information about where time is spent in design 110, the ordering of events, and the like.

In the case where design 110 is partially implemented in hardware as described with reference to FIGS. 1 and 2, then software trace events may be sent to the trace circuitry implemented in hardware for time stamping and storage. As such, both hardware and software trace events may be time stamped by the same timing reference in hardware and combined into a single trace stream without requiring complex correlation and post-processing. The combination of hardware trace events and software trace events may provide detailed information indicating how SOC 200 operates across both hardware and software.

Figure 3:
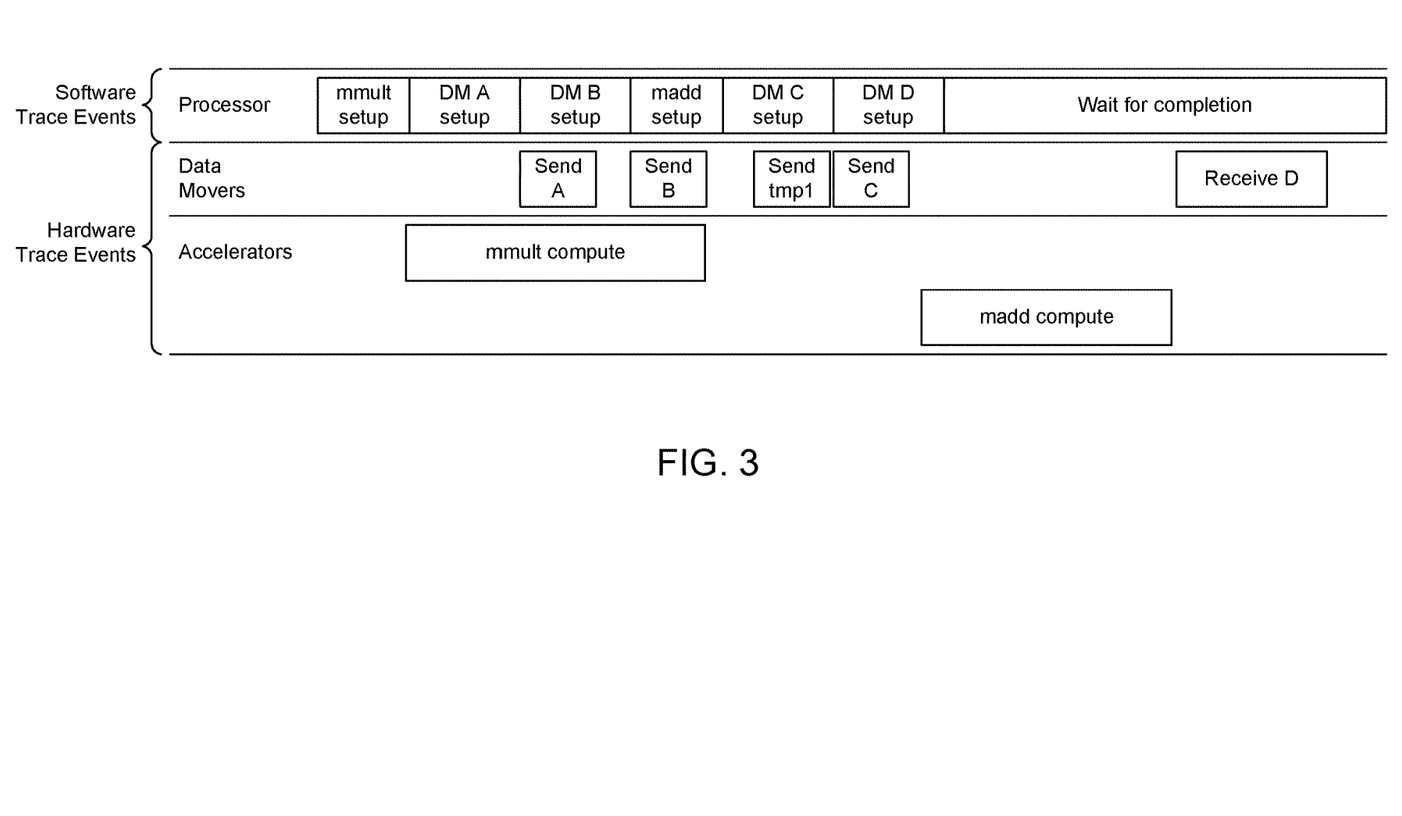
FIG. 3 is a Gantt chart illustrating detected hardware and software trace events.

FIG. 3 is a Gantt chart illustrating detected hardware and software trace events. As pictured, FIG. 3 shows various operations performed by different elements of SOC 200 as determined from detected hardware and software trace events. The top row illustrates operations performed by processor 206 as determined from software trace events generated by execution of instrumented program code 135. Operations such as "mmult setup" and "madd setup" indicate the time consumed by processor 206 in setting up accelerator circuits 222 and 224, respectively, for operation. In one aspect, a setup operation for an accelerator circuit may include processor 206 sending a message or signal to an accelerator circuit indicating that the accelerator circuit will be operating on arguments. Processor 206, as part of the setup operation for an accelerator circuit, may also await an acknowledgement or ready signal from the accelerator circuit being setup indicating a ready state. Accordingly, instrumented program code 135 may generate a software trace event responsive to detecting the start of the "mmult setup" and/or "madd setup" operations and generate further software trace events responsive to detecting the end of the "mmult setup" and/or "madd setup" operations. Each of the software trace events may specify the particular condition detected.

Operations such as "DM A setup," "DM B setup," "DM C setup," and "DM D setup" illustrate setup operations performed by processor 206 to prepare the various data movers (DM) to transfer arguments with accelerator circuits 222 and/or 224. For example, "DM A setup" is the setup operation performed by processor 206 for setting up data mover circuit 214 to transfer argument A from processor 206 to accelerator circuit 222. "DM B setup" is the setup operation performed by processor 206 for setting up data mover circuit 216 to transfer argument B from processor 206 to accelerator circuit 222. "DM C setup" is the setup operation performed by processor 206 for setting up data mover circuit 218 to transfer argument C from processor 206 to accelerator circuit 224. "DM D setup" is the setup operation performed by processor 206 for setting up data mover circuit 220 to transfer argument D from accelerator circuit 224 to processor 206. Accordingly, instrumented program code 135 may generate a software trace event responsive to detecting the start of a "DM 'N' setup" operation and generate a further software trace event responsive to detecting the end of a "DM 'N' setup" operation.

The "Wait for completion" operation indicates the time that processor 206 is idle and waiting for the results from accelerator 224. More particularly, "Wait for completion" time shows the time that processor 206 is idle awaiting data mover circuit 220 to finish the transfer of argument D to processor 206.

Operations illustrated in the data movers row and in the accelerators row are operations determined from hardware trace events detected by the monitor circuits. In FIG. 3, "send A" refers to the transfer of argument A from processor 206 to accelerator circuit 222 by data mover circuit 214. The operation "send A" illustrates the time used by data mover circuit 214 from start to completion for transferring argument A. The operation "send A" may be determined from hardware trace events generated by monitor circuit 230 in monitoring activity of data mover circuit 214, e.g., the start and stop of transferring argument A.

The operation "send B" refers to the transfer of argument B from processor 206 to accelerator circuit 222 by data mover circuit 216. The operation "send B" illustrates the time used by data mover circuit 216 from start to completion for transferring argument B. The operation "send B" may be determined from hardware trace events generated by monitor circuit 232 in monitoring activity of data mover circuit 216. The operation "send B" may be determined from hardware trace events generated by monitor circuit 232 in monitoring activity of data mover circuit 216, e.g., the start and stop of transferring argument B.

The operation "send tmp1" refers to the transfer of the result "tmp1" from accelerator circuit 222 to accelerator circuit 224. For example, accelerator circuit 222 generates tmp1 as a result. The operation "send tmp1" illustrates the time used to transfer argument tmp1 from an output of accelerator circuit 222 to an input of accelerator circuit 224. The operation "send tmp1" may be determined from hardware trace events generated by monitor circuit 248 in monitoring activity of the data path coupling the output of accelerator circuit 222 to the input of accelerator circuit 224. The operation "send tmp1" illustrates that purely hardware trace events may be detected that are still relevant to execution of program code by the processor(s) of the SOC.

The operation "send C" refers to the transfer of argument C from processor 206 to accelerator circuit 224 by data mover circuit 218. The operation "send C" illustrates the time used by data mover circuit 218 from start to completion for transferring argument C. The operation "send C" may be determined from hardware trace events generated by monitor circuit 234 in monitoring activity of data mover circuit 218. The operation "send C" may be determined from hardware trace events generated by monitor circuit 234 in monitoring activity of data mover circuit 218, e.g., the start and stop of transferring argument C.

The operation "receive D" refers to the transfer of argument D from accelerator circuit 222 to processor 206 by data mover circuit 220. The operation "receive D" illustrates the time used by data mover circuit 220 from start to completion for transferring argument D. The operation "receive D" may be determined from hardware trace events generated by monitor circuit 236 in monitoring activity of data mover circuit 220. The operation "receive D" may be determined from hardware trace events generated by monitor circuit 236 in monitoring activity of data mover circuit 220, e.g., the start and stop of transferring argument D.

The "mmult compute" and "madd compute" operations illustrated in the accelerators rows illustrate the time required for accelerator circuits 222 and 224 to operate from start to finish. For example, "mmult compute" represents the time required for accelerator circuit 222 to perform a matrix multiply operation using arguments A and B once received. Monitor circuit 238 may detect the start and end, e.g., completion, of operation by accelerator circuit 222 and generate hardware trace events responsive to detecting the start and end. Similarly, "madd compute" represents the time required for accelerator circuit 224 to perform a matrix add operation using arguments tmp1 and C once received. Monitor circuit 240 may detect the start and end, e.g., completion, of operation by accelerator circuit 224 and generate hardware trace events responsive to detecting the start and end.

FIG. 3 illustrates how the various operations determined from detected hardware and software trace events may be viewed on a common timeline. In one arrangement, a view as illustrated in FIG. 3 may be generated using a data processing system and/or system compiler 105 to display trace data from SOC 200. FIG. 3 illustrates the operation of SOC 200 from a system wide perspective. Further, the various operations shown are at the application level in that the operations relate to particular arguments within design 110 as opposed to smaller transport layer events occurring in hardware of the SOC. The operations illustrated correlate directly to the underlying design 110. The operations relate to the transfer of arguments specified in design 110. In addition, FIG. 3 illustrates the time between application level events that occurs across different subsystems of the SOC.

For example, during regular operation of the hardware, data transfers may take place in bursts or require a large number of smaller transactions. As an illustrative example, argument A may be a video frame that is several megabytes in size. The transfer of argument A from processor 206 to accelerator circuit 222 may require hundreds or even thousands of small data transfers through interconnect 210 and data mover circuit 214. A conventional trace system would provide a large amount of data relating to each of these individual data transfers at the hardware transport level, which are completely disconnected from the application level data unit that is argument A. A designer may be interested in the time required to transfer argument A, as a whole, without having to parse through hundreds or thousands of the individual data transfers required to effectuate transfer of argument A.

In accordance with the inventive arrangements disclosed herein, the monitor circuits may be configured to monitor for these high level events, e.g., the start of transfer of argument A and the completion of the transfer or argument A, and generate hardware trace events accordingly. Further, it should be appreciated that monitor circuits may be added to any bus, interface, and/or signal of the design to be implemented in hardware through instrumentation as described herein.

Figure 4:
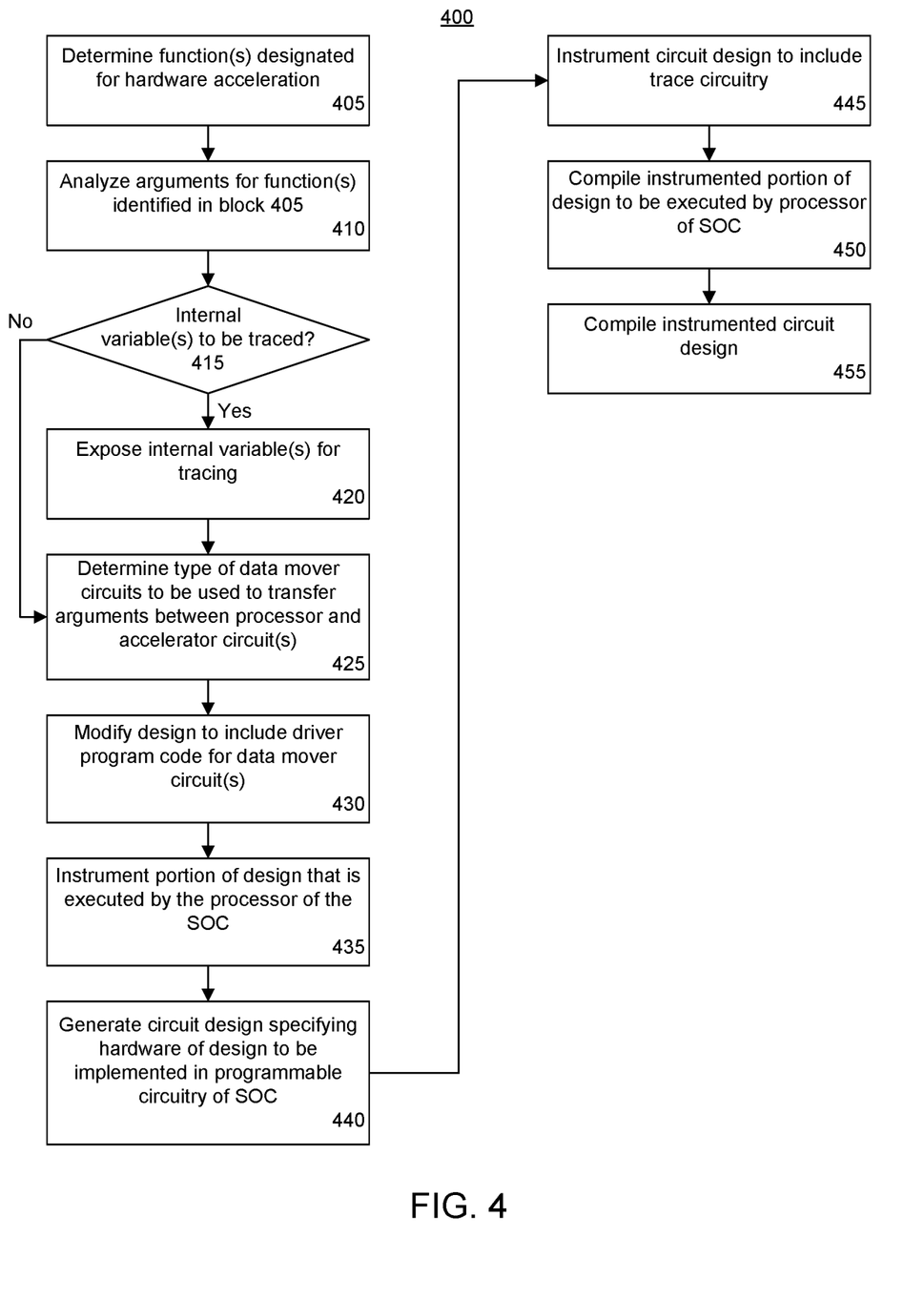
FIG. 4 is a flow chart illustrating an exemplary method of automatically implementing hardware and software tracing for a design for an SOC.

FIG. 4 is a flow chart illustrating an exemplary method 400 of automatically implementing hardware and software tracing for a design for an SOC. Method 400 may be performed by system compiler 105 as described with reference to FIG. 1. In discussing FIG. 4, system compiler 105 is referred to as "the system." FIG. 4 may begin in a state where the system has a design to be implemented in an SOC. The design may be specified as source code in an HLL and include one or more functions designated for hardware acceleration. The design may be intended for implementation within an SOC that includes a processor and programmable circuitry as described with reference to FIG. 2 with tracing enabled.

In block 405, the system may determine the functions of the design that are designated for hardware acceleration. In one example, the functions may be marked responsive to a user request for hardware acceleration of the functions through the system.

In block 410, the system may analyze the arguments for the functions designated for hardware acceleration. The system, for example, may identify the argument(s) provided to each function designated for hardware acceleration as input(s) and the arguments generated by each function as output(s). The system may determine the source and destination of each argument. Referring to Example 1, the system may determine which arguments flow from the processor to the accelerator circuit, from the accelerator circuit to the processor, and from the accelerator circuit to another accelerator circuit. Further, the system may determine the data type of the arguments, size of the arguments, etc.

In block 415, the system may determine whether the any internal variables of the function(s) designated for hardware acceleration are to be traced. Typically, when a function is hardware accelerated, the resulting accelerator circuit is built as a black box with defined inputs and outputs. The internal workings of the accelerator circuit, as generated by the system, may be obscured from the designer. The resulting accelerator circuit may be called by the processor of the SOC like a software function.

In some cases, a designer may indicate a particular variable of a function designated for hardware acceleration that is to be traced. The designer, for example, may designate one or more variables of the function for tracing. The designer, for example, may include a pragma or other marker, via the system, within the function to specify the variable of interest. If one or more internal variables of functions to be hardware accelerated are marked for tracing, method 400 may continue to block 420. If not, method 400 may proceed to block 425.

In block 420, the system may expose the variables for tracing. In one aspect, the system may rewrite the function so that the selected variable is included within the interface of the accelerator circuit that is generated for the function, e.g., rewriting the function so that the designated internal variable is defined as a top level variable available for tracing.

In another aspect, the system may not change the interface of the accelerator circuit. The system may provide additional ports that may be wired to trace circuitry, e.g., a monitor circuit. For example, the system may change the variable to a global variable in the same file. In that case, the system will implement the variable in hardware without changing the interface of the function. The system may then couple the hardware implementation of the global variable to a monitor circuit to observe the internal state of the hardware structure (global variable).

In illustration consider the "mmult" function that is hardware accelerated from Example 1. The actual "mmult" function may include program code that internally copies the arrays into a buffer for processing. The designer may wish to know the beginning and end of that internal buffer process. The designer may mark that operation or buffer variable, which may cause the system to implement hardware tracing for the internal copy process within the resulting accelerator circuit. In this example, the designer wishes to know the start and stop of the buffer copy operation within the accelerator circuit as opposed to the handling of individual elements of the arrays or smaller hardware operations performed in the accelerator circuit. This is another example of hardware trace events at the application level.

In block 425, the system may determine the type of data mover circuits that are to be used to move the arguments between the accelerator circuits and the processor. For example, arguments may be transferred using first-in-first-out (FIFO) memories or direct memory access (DMA) type of data mover circuits. The system may select the appropriate types of data movers according to the arguments that must be transferred between the processor and the accelerator circuit(s) based upon available resources of the SOC, timing requirements of the design, size of arguments to be transferred, and the like.

In one aspect, because the architecture of the programmable circuitry of the SOC is known, the system may utilize known cores for implementing interconnect circuits, data mover circuits, and the like to effectuate the implementation of accelerator circuits in the programmable circuitry.

In block 430, the system may modify the design to include driver program code for the data mover circuits selected in block 425. For example, the system may modify the design so that invocation of a function designated for hardware acceleration invokes the driver program code that is added to the design for communicating with the appropriate data mover circuits for transferring the arguments between the processor and data mover circuits. The driver program code may be specific to the particular type of data mover circuit(s) that are selected and allow the processor to read from and/or write to the data mover circuits. The driver program code may be executed by the processor so that the processor may interact, e.g., read and write arguments, to the data mover circuits to exchange arguments with the accelerator circuits.

In block 435, the system may instrument the portion of the design that is to be executed by the processor of the SOC. For example, the system may insert instrumentation program code that generates software trace events responsive to the start and stop of operations such as accelerator circuit setup operations, data mover circuit setup operations, the sending of an argument to a data mover circuit, the receipt of an argument from a data mover circuit, and/or waiting for the operation of an accelerator to complete. As noted, the system may also instrument other program code such as other libraries, the operating system, or the like.

For purposes of illustration, the system may instrument the design at the source code level. It should be appreciated, however, that instrumentation of the portion of the design, and/or other program code, to be executed by the processor may also be performed on the resulting executable during and/or after compilation.

In block 440, the system may generate a circuit design specifying the hardware of the design that is to be implemented within the programmable circuitry of the SOC. The circuit design implements hardware acceleration of the functions identified in block 405. For example, the system may convert the function(s) designated for hardware acceleration into HDL or a netlist. The system further may include cores for the interconnect circuit(s) and/or data mover circuits necessary for transferring arguments between the processor and the accelerator circuit(s) as described with reference to FIG. 2.

In block 445, the system may instrument the circuit design. The system may modify the circuit design, whether specified in HDL or as a netlist, with trace circuitry specified in HDL or as a netlist as appropriate. In one aspect, the system may add a monitor circuit for one or more or for each data mover circuit. Since the types of data mover circuits are known, the system may add monitor circuits adapted to communicate with the various types of data mover circuits included in the circuit design.

The system may also add a monitor circuit for each accelerator circuit. Again, since the data movers used for transferring arguments for the accelerator circuit(s) are known and the structure of the accelerator circuit(s) is known, the monitor circuits may be adapted to detect hardware trace events as discussed. In another aspect, the system may include a monitor circuit for one or more of the interconnect circuits included in the circuit design. The system may also include a monitor circuit for accelerator circuit to accelerator circuit connections and/or other buses, interfaces, and/or signals.

The system may configure the monitor circuits to generate hardware trace events according to the particular arguments, operations, and/or operating states designated for monitoring. Since the system has access to the original design, the system may determine the particular conditions, e.g., signals and operating states, that the monitor circuits detect that trigger or cause the output of hardware trace events. For example, the system may implement transport event specific monitor circuits.

In other arrangements, the system may implement further monitor circuits. For example, one or more accelerator circuits may be coupled to the memory controller within the processor system. In that case, a monitor circuit may be added and configured to detect particular memory accesses by the accelerator circuit. In another example, if the memory being accessed is organized into a plurality of memory banks, the monitor circuit may be configured to detect accesses to particular memory banks by evaluating addressing bits and output hardware trace events for one or more particular memory banks. Thus, a designer may determine how often a particular circuit, e.g., an accelerator circuit, is accessing one or more particular memory banks.

Further, the system may include the trace event handling circuitry. The system may establish connections between the monitor circuits and the particular circuit blocks being monitored, establish connections of the outputs of the monitor circuits to the time stamp circuit of the trace event handling circuitry, establish connections between the time stamp circuit and the merge circuit, and establish connections between the merge circuit and the output circuit.

In block 450, the system may compile the instrumented portion of the design that is to be executed by the processor of the SOC. The system may generate an executable file or a binary file. In block 455, the system may compile the instrumented circuit design. For example, the system may synthesize, place, and route the instrumented circuit design. The system may also generate a configuration bitstream.

Figure 5:
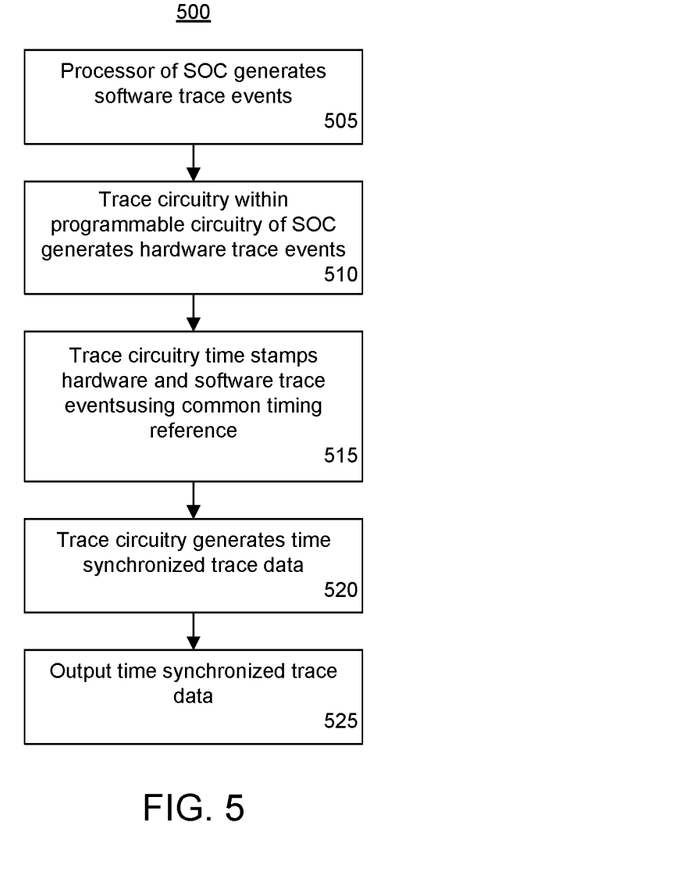
FIG. 5 is a flow chart illustrating an exemplary method of operation for an SOC instrumented for hardware and software tracing.

FIG. 5 is a flow chart illustrating an exemplary method 500 of operation for an SOC instrumented for hardware and software tracing. Method 500 may be implemented by an SOC having implemented an instrumented design therein as described within this disclosure. Method 500 may begin in a state where the SOC is operating. The processor is executing program code of the design and functions have been implemented as accelerator circuits within the programmable circuitry of the SOC.

In block 505, the processor of the SOC may generate one or more software trace events. In one aspect, the processor may generate the software trace events responsive to invoking, or attempting to invoke, a function that has been hardware accelerated. For example, the processor, in executing the instrumented program code, may detect particular conditions, e.g., events, including, but not limited to, the start and/or end of a setup operation for the accelerator circuit, the start and/or end of a setup operation for a data mover circuit configured to transfer an argument between the processor to the accelerator circuit, or the like. In response to detecting the conditions or events, the processor generates the software trace events. It should be appreciated that each software trace event may include an identifier specifying the particular condition or event detected for which the software trace event is generated.

As discussed, the processor of the SOC may generate software trace events relating to program code other than the application. For example, the processor may generate software trace events relating to operating system events and/or relating to execution of program code from particular libraries and the like.

In block 510, the trace circuitry implemented within programmable circuitry of the SOC may generate hardware trace events for operation of an accelerator circuit implementing the function within the programmable circuitry. In one aspect, the hardware trace events may be application level trace events. For example, the trace circuitry may detect conditions or events in hardware including, but not limited to, the start and/or end of the transfer of an argument between the processor and the accelerator circuit by a data mover circuit implemented within the programmable circuitry, the start and/or end of operation of the accelerator circuit, the direction of a read and/or a write in the case of a bidirectional data transfer, or the like. In response to detecting the conditions or events, the monitor circuits generate the hardware trace events. It should be appreciated that each hardware trace event may include an identifier specifying the particular condition or event detected for which the hardware trace event is generated.

In block 515, the trace circuitry may time stamp the hardware and software trace events using a common or same clock source. The trace circuitry may time stamp hardware and software trace events using the same clock, where the clock may be a counter also, so that the hardware and software trace events may be considered in a same, or unified, timeline. In block 520, the trace circuitry may generate time synchronized trace data. As defined herein, the term "time synchronized trace data" refers to hardware and software trace events time stamped using a common timing reference.

In block 525, the trace circuitry may output the time synchronized trace data. In one aspect, the trace circuitry may output the time synchronized trace data to a system such as a data processing system and/or the system compiler. The data processing system may generate a display as shown in FIG. 3 illustrating the timing and relative timing of the various operations performed across both the hardware and software of the SOC.

Figure 6:
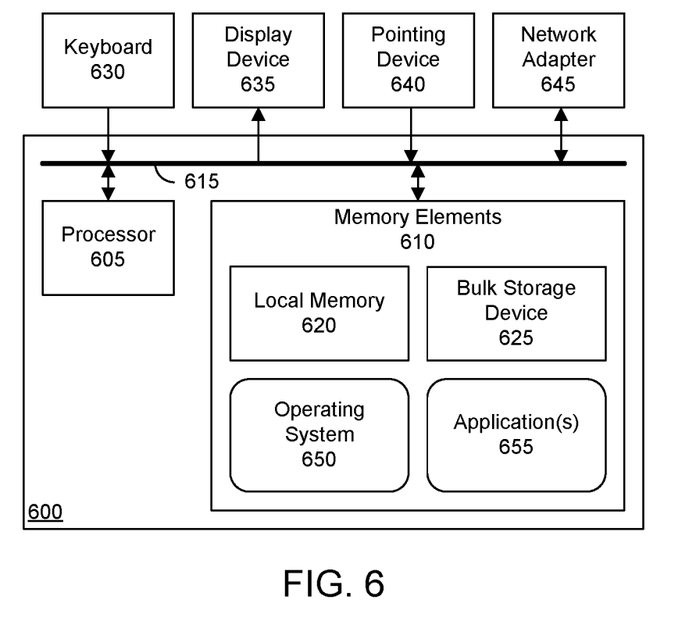
FIG. 6 is a block diagram illustrating an exemplary architecture for a data processing system.

FIG. 6 is a block diagram illustrating an exemplary architecture for a data processing system. Architecture 600 may be used to implement systems and/or devices that include a processor and memory and that are capable of performing the operations described within this disclosure. For example, referring to FIG. 1, architecture 600, or a variant of architecture 600, may be used to implement system compiler 105 of FIG. 1.

As pictured, architecture 600 includes at least one processor, e.g., a central processing unit (CPU), 605 coupled to memory elements 610 through a system bus 615 or other suitable circuitry. Architecture 600 stores computer-readable program instructions (also referred to as "program code") within memory elements 610. Memory elements 610 may be considered an example of computer readable storage media. Processor 605 executes the program code accessed from memory elements 610 via system bus 615.

Memory elements 610 may include one or more physical memory devices such as, for example, a local memory 620 and one or more bulk storage devices 625. Local memory 620 refers to random access memory (RAM) or other non-persistent memory device(s) generally used during actual execution of the program code. Bulk storage device 625 may be implemented as a hard disk drive (HDD), solid state drive (SSD), or other persistent data storage device. Architecture 600 may also include one or more cache memories (not shown) that provide temporary storage of at least some program code in order to reduce the number of times program code must be retrieved from bulk storage device 625 during execution.

Input/output (I/O) devices such as a keyboard 630, a display device 635, and a pointing device 640 may optionally be coupled to architecture 600. In some cases, one or more of the I/O devices may be combined as in the case where a touchscreen is used as display device 635. In that case, display device 635 may also implement keyboard 630 and/or pointing device 640. The I/O devices may include one or more network adapters 645 that may be coupled to architecture 600 to enable architecture 600 to become coupled to other systems, computer systems, remote printers, and/or remote storage devices through intervening private or public networks and/or through direct connections (e.g., peer-to-peer connections). Modems, cable modems, Ethernet cards, and wireless transceivers (e.g., wireless radios) are examples of different types of network adapter 645 that may be used with architecture 600. Depending upon the particular device implemented with architecture 600, the specific type of network adapter, or network adapters as the case may be, will vary.

As pictured in FIG. 6, memory elements 610 store an operating system 650 and one or more applications 655 such as an application that, when executed, causes a system to perform the operations described herein with reference to system compiler 105. In one aspect, operating system 650 and application 655, being implemented in the form of program code, are executed by architecture 600. For example, processor 605 may execute operating system 650 and/or application 655. As such, operating system 650 and application 655 may be considered an integrated part of architecture 600. Operating system 650, application 655, and any data items used, generated, and/or operated upon by architecture 600 are functional data structures that impart functionality when employed as part of a system or device implemented using architecture 600.

In some cases, the particular device or system implemented using architecture 600 may include fewer components or more components than shown. Further, the particular operating system and/or application(s) included may vary.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise.

For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of computer readable storage media. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

In some instances, the term "signal" may be used within this disclosure to describe physical structures such as terminals, pins, signal lines, wires. In other instances, the term "signal" may be used to refer to particular values specified by a wire. The term "signal" may refer to the conveyance of a single bit, e.g., a single wire, or the conveyance of multiple parallel bits through multiple parallel wires. Further, each signal may represent bi-directional communication between two, or more, components connected by the signal.

A computer program product may include a computer readable storage medium (or media) having computer readable program instructions thereon for causing a processor to carry out aspects of the inventive arrangements described herein. Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider).

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of automatically implementing event tracing for an SOC may include instrumenting, using a computer, a design for the SOC with instrumentation program code that, responsive to execution by a processor of the SOC, generates software trace events. The design may be specified in an HLL. The method may include generating, using the computer, a circuit design specifying an accelerator circuit for a function of the design. The accelerator circuit may be configured for implementation within programmable circuitry of the SOC. The method may also include instrumenting, using the computer, the circuit design to include trace circuitry. The trace circuitry may be configured to detect hardware trace events for operation of the accelerator circuit, receive the software trace events, and combine the hardware and software trace events into time synchronized trace data.

In one aspect, the hardware trace events may indicate accelerator circuit processing time for arguments of the function.

In another aspect, the hardware trace events may indicate transfers of arguments of the function designated for hardware acceleration.

Generating a circuit design may include adding a data mover circuit configured to transfer an argument between the processor and the accelerator circuit. Instrumenting the circuit design to include trace circuitry may include inserting a first monitor circuit coupled to the data mover circuit and configured to generate hardware trace events responsive to detecting transfer of the argument through the data mover circuit.

Instrumenting the circuit design to include trace circuitry may include inserting a second monitor circuit coupled to the accelerator circuit. The second monitor circuit may be configured to detect hardware trace events for operation of the accelerator circuit. Instrumenting the circuit design to include trace circuitry may include inserting a time stamp circuit configured to time stamp the hardware and software trace events using a common timing reference.

Instrumenting the circuit design to include trace circuitry may include inserting a merge circuit configured to receive the time stamped hardware and software trace events as a plurality of data streams and merge the data streams into the time synchronized trace data.

One or more of the software trace events may be generated responsive to invoking the function of the design.

An SOC may include a processor configured to execute instrumented program code and, responsive to execution of the instrumented program code, output software trace events. The SOC may include an accelerator circuit configured to implement a hardware accelerated function in programmable circuitry of the SOC. The accelerator circuit may be coupled to the processor. The SOC may include a trace circuitry implemented within the programmable circuitry of the SOC and coupled to the processor and accelerator circuit. The trace circuitry may be configured to detect hardware trace events, receive the software trace events, and generate time synchronized trace data.

In one aspect, the hardware trace events may indicate transfers of arguments for the hardware accelerated function of a design for the SOC specified in an HLL.

The trace circuitry may include a first monitor circuit coupled to the accelerator circuit and configured to detect the hardware trace events for the accelerator circuit.

The trace circuitry may also include a time stamp circuit configured to time stamp the software trace events and the hardware trace events according to a common timing reference and a merge circuit configured to merge time stamped hardware and software trace events from the time stamp circuit.

The SOC may include a data mover circuit implemented in the programmable circuitry and configured to transfer arguments between the processor and the accelerator circuit.

The SOC may include a second monitor circuit coupled to the data mover circuit and configured to generate hardware trace events to the time stamp circuit indicating transfer of the arguments.

The SOC may also include an interconnect circuit coupling the processor to the time stamp circuit. The interconnect circuit may route the software trace events from the processor to the time stamp circuit.

A method of tracing hardware and software of an SOC may include generating software trace events using a processor of the SOC and generating, using trace circuitry implemented within programmable circuitry of the SOC, hardware trace events for operation of an accelerator circuit within the programmable circuitry. The method may include time stamping, using the trace circuitry, the hardware and software trace events using a common timing reference and generating, using the trace circuitry, time synchronized trace data including the time stamped hardware and software trace events.

In one aspect, the hardware trace events may be application level trace events.

Generating software trace events may include detecting a setup operation for the accelerator circuit.

Generating software trace events may include detecting a setup operation for a data mover circuit configured to transfer an argument between the processor and the accelerator circuit.

Generating hardware trace events may include detecting transfer of an argument between the processor and the accelerator circuit by a data mover circuit implemented within the programmable circuitry.

Generating hardware trace events may include detecting operating time of the accelerator circuit.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of automatically implementing event tracing for a system-on-chip, comprising:
    instrumenting, using a computer, a design for the system-on-chip with instrumentation program code that, responsive to execution by a processor of the system-on-chip, generates software trace events;
    wherein the design is specified in a high level programming language as source code;
    generating, using the computer, a circuit design specifying an accelerator circuit for a function of the design, wherein the accelerator circuit is configured for implementation within programmable circuitry of the system-on-chip;
    instrumenting, using the computer, the circuit design to include trace circuitry, wherein the trace circuitry is configured to detect hardware trace events for operation of the accelerator circuit, receive the software trace events, and combine the hardware and software trace events into time synchronized trace data; and
    wherein the hardware trace events indicate transfers of arguments for the function of the design and the transfers of arguments correspond to arguments of the function from the source code.

2. The method of claim 1, wherein the hardware trace events indicate accelerator circuit processing time for arguments of the function.

3. The method of claim 1, wherein the hardware trace events indicate transfers of arguments of the function designated for hardware acceleration.

4. The method of claim 1, wherein:
    the generating a circuit design comprises adding a data mover circuit configured to transfer an argument between the processor and the accelerator circuit, wherein the data mover circuit is implemented in the programmable circuitry; and
    the instrumenting the circuit design to include trace circuitry comprises inserting a first monitor circuit coupled to the data mover circuit and configured to generate hardware trace events indicating transfer of the argument to the accelerator circuit and inserting a second monitor circuit coupled to the accelerator circuit, wherein the second monitor circuit is configured to detect hardware trace events for the accelerator circuit.

5. The method of claim 4, wherein the instrumenting the circuit design to include trace circuitry further comprises:
    inserting a time stamp circuit configured to time stamp the hardware and software trace events using a common timing reference.

6. The method of claim 5, wherein the instrumenting the circuit design to include trace circuitry further comprises:
    inserting a merge circuit configured to receive the time stamped hardware and software trace events as a plurality of data streams and merge the data streams into the time synchronized trace data.

7. The method of claim 1, wherein at least one of the software trace events is generated responsive to invoking the function of the design.

8. A system-on-chip, comprising:
    a processor configured to execute instrumented program code and, responsive to execution of the instrumented program code, output software trace events;
    an accelerator circuit configured to implement a hardware accelerated function in programmable circuitry of the system-on-chip, wherein the accelerator circuit is coupled to the processor;
    a trace circuitry implemented within the programmable circuitry of the system-on-chip and coupled to the processor and accelerator circuit;
    wherein the trace circuitry is configured to detect hardware trace events, receive the software trace events, and generate time synchronized trace data; and
    wherein the hardware trace events indicate transfers of arguments for the hardware accelerated function specified by a design for the system-on-chip, wherein the design is specified in a high level programming language as source code and the transfers of arguments correspond to arguments of the hardware accelerated function from the source code.

9. The system-on-chip of claim 8, wherein the trace circuitry comprises:
    a first monitor circuit coupled to the accelerator circuit and configured to detect the hardware trace events for the accelerator circuit;
    a data mover circuit implemented in the programmable circuitry and configured to transfer arguments between the processor and the accelerator circuit; and
    a second monitor circuit coupled to the data mover circuit and configured to generate hardware trace events indicating transfer of the arguments to the accelerator circuit.

10. The system-on-chip of claim 9, further comprising:
    an interconnect circuit coupling the processor to the data mover circuit;

a third monitor circuit coupled to the interconnect circuit and configured to generate hardware trace events indicating transfer of arguments through the interconnect circuit.

11. The system-on-chip of claim 8, wherein the trace circuitry comprises:
   a time stamp circuit configured to time stamp the software trace events and the hardware trace events according to a common timing reference; and
   a merge circuit configured to merge time stamped hardware and software trace events from the time stamp circuit.

12. The system-on-chip of claim 8, further comprising:
   an interconnect circuit coupling the processor to the time stamp circuit, wherein the interconnect circuit routes the software trace events from the processor to the time stamp circuit.

13. A method of tracing hardware and software of a system-on-chip, comprising:
   generating software trace events using a processor of the system-on-chip;
   generating, using trace circuitry implemented within programmable circuitry of the system-on-chip, hardware trace events for operation of an accelerator circuit within the programmable circuitry;
   time stamping, using the trace circuitry, the hardware and software trace events using a common timing reference;
   generating, using the trace circuitry, time synchronized trace data comprising the time stamped hardware and software trace events; and
   wherein the hardware trace events indicate transfers of arguments for the hardware accelerated function specified by a design for the system-on-chip, wherein the design is specified in a high level programming language as source code and the transfers of arguments correspond to arguments of the hardware accelerated function from the source code.

14. The method of claim 13, wherein the hardware trace events are application level trace events.

15. The method of claim 13, wherein the generating software trace events comprises:
   detecting a setup operation for the accelerator circuit.

16. The method of claim 13, wherein the generating software trace events comprises:
   detecting a setup operation for a data mover circuit configured to transfer an argument between the processor and the accelerator circuit.

17. The method of claim 13, wherein the generating hardware trace events comprises:
   detecting transfer of an argument between the processor and the accelerator circuit by a data mover circuit implemented within the programmable circuitry.

18. The method of claim 13, wherein the generating hardware trace events comprises:
   detecting operating time of the accelerator circuit.

19. The method of claim 13, wherein the trace circuitry comprises:
   a first monitor circuit coupled to the accelerator circuit and configured to detect the hardware trace events for the accelerator circuit;
   a data mover circuit implemented in the programmable circuitry and configured to transfer arguments between the processor and the accelerator circuit; and
   a second monitor circuit coupled to the data mover circuit and configured to generate hardware trace events indicating transfer of the arguments to the accelerator circuit.

* * * * *